US009183118B2

(12) United States Patent
Randimbivololona

(10) Patent No.: US 9,183,118 B2
(45) Date of Patent: Nov. 10, 2015

(54) METHOD FOR SIMULATING A SYSTEM ON BOARD AN AIRCRAFT FOR TESTING AN OPERATING SOFTWARE PROGRAM AND DEVICE FOR IMPLEMENTING SAID METHOD

(75) Inventor: Famantanantsoa Randimbivololona, Toulouse (FR)

(73) Assignee: AIRBUS OPERATIONS SAS, Toulouse (FR)

( * ) Notice: Subject to any disclaimer, the term of this patent is extended or adjusted under 35 U.S.C. 154(b) by 1100 days.

(21) Appl. No.: 12/600,519

(22) PCT Filed: May 19, 2008

(86) PCT No.: PCT/FR2008/050859
§ 371 (c)(1),
(2), (4) Date: Apr. 26, 2010

(87) PCT Pub. No.: WO2008/142355
PCT Pub. Date: Nov. 27, 2008

(65) Prior Publication Data
US 2010/0218172 A1 Aug. 26, 2010

(30) Foreign Application Priority Data
May 24, 2007 (FR) ...................... 07 55235

(51) Int. Cl.
*G06F 11/36* (2006.01)
*G06F 9/44* (2006.01)
*G06F 11/26* (2006.01)
*G06F 11/34* (2006.01)
*G06F 17/50* (2006.01)

(52) U.S. Cl.
CPC .......... *G06F 11/3664* (2013.01); *G06F 11/261* (2013.01); *G06F 11/3457* (2013.01); *G06F 17/5009* (2013.01)

(58) Field of Classification Search
CPC ................................... G06F 11/3664
USPC ......................................... 717/135
See application file for complete search history.

(56) References Cited

U.S. PATENT DOCUMENTS

| 5,440,697 | A  | * | 8/1995 | Boegel et al. ............... 703/21 |
| 5,541,863 | A  | * | 7/1996 | Magor et al. ............... 702/122 |
| 5,815,653 | A  |   | 9/1998 | You et al. |
| 6,071,316 | A  | * | 6/2000 | Goossen et al. ............ 717/126 |
| 6,230,114 | B1 | * | 5/2001 | Hellestrand et al. ......... 703/13 |
| 6,766,510 | B2 | * | 7/2004 | Takeda ...................... 717/127 |
| 7,031,897 | B1 | * | 4/2006 | Blomgren et al. ............ 703/14 |

(Continued)

FOREIGN PATENT DOCUMENTS

| EP | 0 567 722 A | 11/1993 |
| EP | 685793 A2 * | 12/1995 ............ 714/E11.168 |

*Primary Examiner* — Wei Zhen
*Assistant Examiner* — Brahim Bourzik
(74) *Attorney, Agent, or Firm* — Dickinson Wright PLLC

(57) ABSTRACT

A method for simulating a real on-board system for testing an operating software program. The disclosed embodiments include preparation of a test to be carried out on the operating software program, by adding and/or removing control functions to/from a library; execution of the operating software program of the real on-board system in a simulated environment; simulation of a dedicated peripheral by activating functions from the library; transmission of the test results from the dedicated peripheral to the results folders stored on the host platform and recording of the aforementioned results.

8 Claims, 1 Drawing Sheet

(56) References Cited

U.S. PATENT DOCUMENTS

| | | | |
|---|---|---|---|
| 7,165,201 B2* | 1/2007 | Groz | 714/741 |
| 7,490,032 B1* | 2/2009 | Koh et al. | 703/22 |
| 8,146,057 B1* | 3/2012 | Michelsen | 717/124 |
| 2003/0004663 A1* | 1/2003 | Masella et al. | 702/66 |
| 2003/0009305 A1* | 1/2003 | Eden | 702/119 |
| 2003/0135791 A1* | 7/2003 | Natvig | 714/38 |
| 2004/0122637 A1* | 6/2004 | Askew et al. | 703/2 |
| 2005/0071125 A1* | 3/2005 | Groz | 702/186 |
| 2007/0168744 A1* | 7/2007 | Pal et al. | 714/38 |
| 2009/0240483 A1* | 9/2009 | Adams et al. | 703/15 |
| 2011/0288840 A1* | 11/2011 | Kropinski et al. | 703/8 |

* cited by examiner

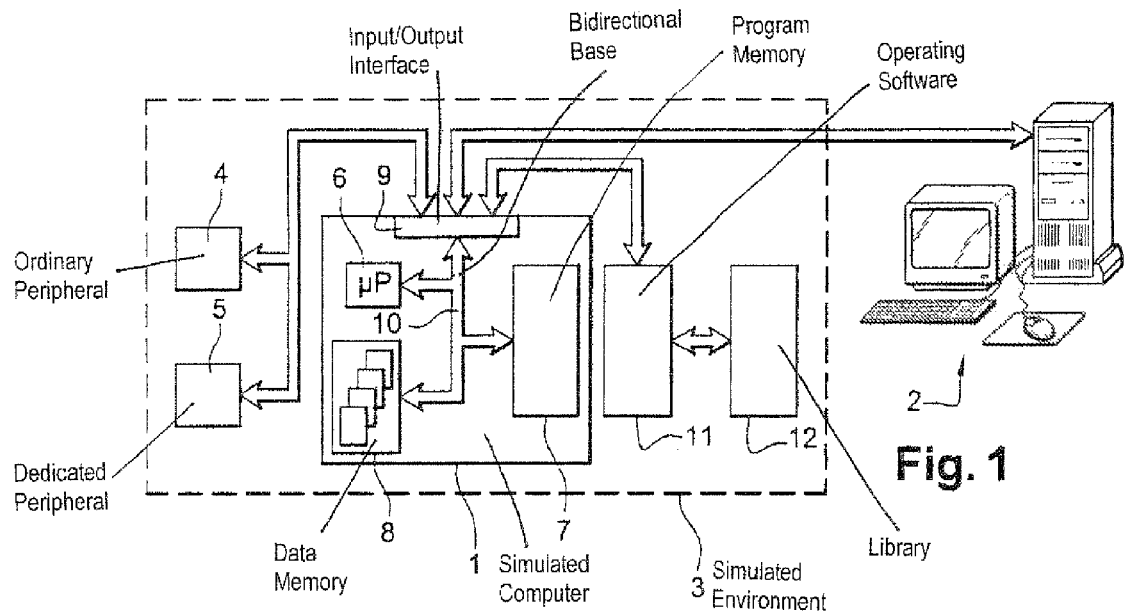
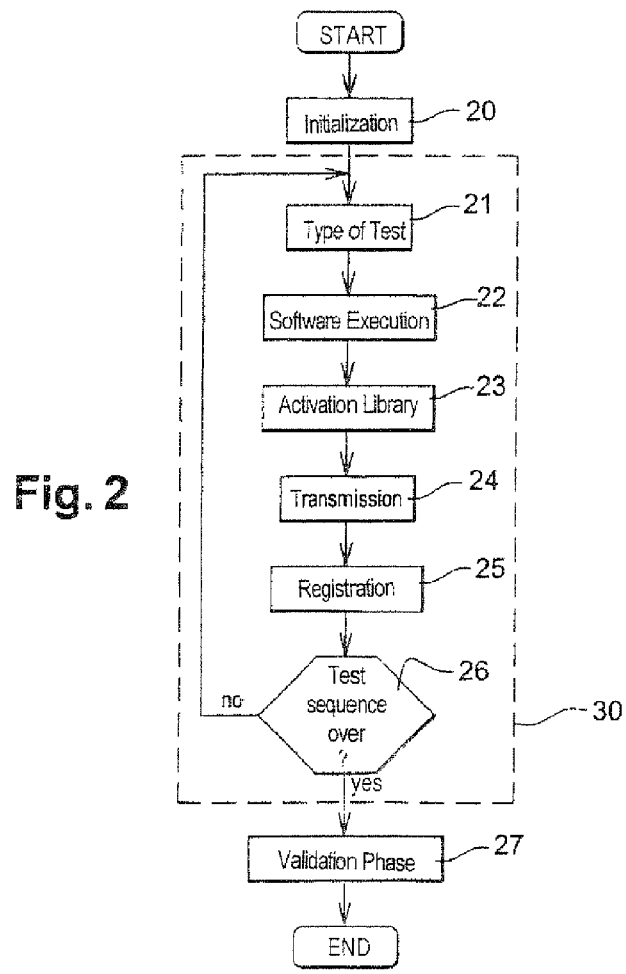

METHOD FOR SIMULATING A SYSTEM ON BOARD AN AIRCRAFT FOR TESTING AN OPERATING SOFTWARE PROGRAM AND DEVICE FOR IMPLEMENTING SAID METHOD

CROSS-REFERENCE TO RELATED APPLICATIONS

This application is the National Stage of International Application No. PCT/FR2008/050859 International Filing Date, 19 May 2008, which designated the United States of America, and which International Application was published under PCT Article 21 (s) as WO Publication No. 2008/142355 A2 and which claims priority from, and the benefit of, French Application No. 200755235 filed on 24 May 2007, the disclosures of which are incorporated herein by reference in their entireties.

The aspects of the disclosed embodiments are in the field of safety of operating systems when the operation of those systems depends on a sequence of logic instructions being executed in a computer.

In particular, the subject matter of the disclosed embodiments is a method of simulating a system that must execute sequences of logic instructions, especially a system with high safety requirements, such as an electronic system intended to be placed onboard an aircraft.

The method allows a user to be able to run sequences of logic instructions on a host platform, other than the hardware on which the software is designed to be run normally. The disclosed embodiments are very advantageous but not exclusive applications in the field of aeronautics and, more specifically, in the field of performing tests on the operating software of onboard systems.

BACKGROUND

For safety reasons, the systems designed to be placed onboard an aircraft have to undergo tests to make sure they run smoothly and show that said systems meet the certification requirements before an aircraft equipped with such systems is authorized to fly and to enter into commercial service.

Before they are installed, these systems now undergo many tests to make sure they meet the integrity, safety and other requirements issued by the certification authorities. These onboard systems can be specialized computers designed to perform functions that may be crucial for the aircraft, for example pilot functions. Hereinafter, these systems will be called computers.

Most often, in the architectures of the current systems, each computer is dedicated to one or more applications of the same kind, for example flight control applications. Each computer has a hardware part and a software part. The hardware part includes at least one central processing unit (CPU) and at least one input/output unit by which the computer is connected to a network of computers, external peripherals, etc.

One basic feature of onboard systems, often used in the field of aeronautics, is associated with an architecture, both hardware and software, that prevents the introduction, as much as possible, of any means not necessary to perform the functions dedicated to said systems.

Thus, contrary to the systems generally encountered in applications commonly used in aeronautics, the computer is not equipped with a complex operating system. Moreover, the software is written in a language as close as possible to the language understood by the central processing unit, and the only inputs/outputs available are those necessary to operate the system, for example information coming from sensors or other elements of the aircraft or information intended for actuators or other elements.

The advantage of this type of architecture is the fact that the operation of such a system is much better controlled. It is not dependent on a complex operating system, some aspects of whose operation depend on parameters that are not controlled and that would otherwise have to be subject to the same demonstrations of safety as the applications software. The system is simple and less vulnerable, since it has only the means strictly needed to perform the functions assigned to said system.

On the other hand, the operation of such a system is much harder to observe. For example, the system has no conventional man/machine interfaces, like keyboards or screens, which would make it possible to be sure the sequences of instructions are being carried out properly and to interact with them, which makes it hard to run the tests essential during software development, verification and qualification.

The software part of the computer includes software specific to the application considered and ensures the operation of the computer, whose logic instructions correspond to algorithms that determine the operation of the system.

To obtain certification for the system, prior to its commissioning and that of the aircraft, a computer validation phase is carried out.

As is known, the validation phase generally consists of verifying, at each step in the process of making the computer, that it meets the specifications that have been set so that said computer gives the operating responses expected from the system.

This conformity to specifications is done, particularly for the software, in successive steps from verifying the simplest software components to the complete software program containing all components that must be built into the target computer.

In the first verification step, the simplest software elements that can be tested are put through so-called unit tests. These tests make sure that the logic instructions, i.e., the code, for said software elements, taken individually, have been written in accordance with the design requirements.

In the second, so-called integration step, different software components that have been put through isolated tests individually are integrated to create an assembly in which the software components interact. These different software components are put through integration tests designed to make sure that the software components are compatible, particularly in terms of the functional interfaces between said components.

In the third step, all of the software components are built into the computer for which they are intended. Validation tests are then done to show that the software, made up of all the components built into the computer, meets the specification, i.e., that it performs the functions expected and that it operates reliably and safely.

To guarantee that a software program is safe and to meet the certification requirements, it is also necessary, in this validation phase, to show that all of the tests which the software has gone through make it possible to conclude, with an adequate level of assurance, that the software meets the security requirements of the system into which it is built.

The different tests done on the software during the validation phase make it possible to be sure that no malfunction of said software (which could have an impact on the proper operation of the computers and consequently on the aircraft and its safety) can occur or that, if a malfunction does occur, the software can handle it.

However, during the validation phase, and especially for the operations to investigate when there are problems, it is often necessary to make sure not only that the input and output parameters of the computer in which the software is installed meet the expectations, but also that certain internal behaviors of the software are correct.

In this case, because of the specific architecture of the specialized computers for onboard applications, it is generally very difficult to observe the operation of the software without using special devices and methods.

The first known method consists of setting up a file distribution system between the computer being tested with the software installed and an associated platform, using simulators. A simulator is understood to be a device that makes it possible to simulate, on the associated platform, the logic operation of a calculating unit, a processor of the computer.

In such an operating mode with a simulator, the computer processor is replaced by a probe that serves as an interface with the associated platform for the simulation of the processor.

Thus, it is possible to have the software being tested run on the computer, except for the processor part and, through functions proper to the associated platform, to observe the operation or certain internal malfunctions of the software, for example, in response to simulations of inputs of the input/output units, and to observe the outputs of said input/output units.

This first method has many drawbacks. Actually, each type of computer being tested requires a specific test bench or at least a very specialized configuration of a test bench. A test bench is an assembly that includes, in particular, means of interconnection with the computer being tested, means of simulating the computer processor or processors and means of running test programs.

Since each processor requires a specific simulator, both for the simulation software and for the probe connected in place of the processor, it is necessary to have multiple simulators according to the definitions of the computers.

Moreover, the possibilities of investigating with simulators are generally limited. The need to work with the specific machine language of the processor under consideration implies that the user be a specialist in machine-language programming.

What is more, a simulator is an expensive product that is generally produced only in small quantities. The life cycle of this type of product is very short (6 months to 2 years), while the means of development and verification must be maintained in operating condition (regulations, industrial reactivity) for the duration of the aircraft program (20 years or more). This translates into problems dealing with obsolescence that are increasingly difficult to solve.

This simulator solution therefore proves poorly suited, since besides its limited performance in terms of investigation, it is expensive to set up and expensive to maintain.

The cost is also hurt by the fact that different processor models are generally used to provide functional redundancy, through design safety, thus multiplying the need for simulators.

A second method, which is aimed at eliminating the simulator problems, consists of simulating the operation of the computer that must run the program being tested on a host platform. In this case, the software being tested must access files on the host platform, either to read the test vectors or to record test results.

Since the software being tested does not naturally have functions for such access to the files on the host platform, it is necessary to modify the software being tested to integrate these access functions.

To transfer the information, generally system calling instructions are used that are issued by the simulated test environment. The system calling instructions can be, for example, to open a file, write a file or read a file. The system calling instructions are intercepted by the operating system of the host platform, which converts them into system calls from the host platform.

This second method also has drawbacks. Actually, the variety of files is such that the development of access functionalities is very dependent on the host platform and its operating system. Now, the variability of the host platforms is huge both in space (for development teams scattered all over the world) and in time (replacing host platforms), which poses practical problems using the method.

These problems are accentuated by the fact that the skills of experts, who can modify the functions of the operating systems, are required to develop such functionalities to access the file systems, and therefore cannot be assigned to test specialists.

Consequently, this method has proven expensive and hard to use.

What is more, this method is very intrusive in terms of the software being tested, and modifying software to run tests on it causes the risk of interfering with the operation of the software itself.

SUMMARY

One aspect of the disclosed embodiments is to fix the drawbacks of the techniques described previously. To this end, the disclosed embodiments propose a method that makes it possible to add access functionalities to test results files on a host platform. This addition of functionalities makes it possible to record or read the results of the tests performed. The addition of functionalities proposed by the disclosed embodiments is simulated on a virtual target. This virtual target is also called a test performance environment.

One aspect of the disclosed embodiments is a method of simulating the test environment of a real onboard system, on a host platform, to test operating software.

More specifically, One aspect of the disclosed embodiments is a test method for the operating software of an onboard system in a virtual test environment on a host platform wherein it includes the following steps:

prepare a test to be performed on the operating software by adding and/or removing control functions in a function library connected to said software, run the operating software of the real onboard system in a virtual environment, simulate a dedicated peripheral by activating a control function from the library, observe all of the test results from the operating software and introduce new input/output functionalities in addition to those offered by the computer of the onboard system, send the test results on the operating software from the dedicated peripheral to results files supported by the host platform and record those results.

The disclosed embodiments may also include one or more of the following characteristics:

the dedicated peripheral has a virtual address that corresponds to a real address in the simulated environment supported by the host platform, the address space is a memory space reserved for inputs/outputs, the library of the simulated onboard system has a library of control functions that the operating software activates to control and guide the dedicated peripheral, the control functions from the library are completely independent of the type of operations performed by an ordinary peripheral.

One aspect of the disclosed embodiments is also a device to simulate the operation of a system computer placed onboard an aircraft, wherein it uses the method, as described above.

This device can have one or more of the following characteristics:

it has a virtual test environment on a host platform that has a virtual computer, an ordinary peripheral and a dedicated peripheral, the virtual computer has an arithmetic and logic unit, a data memory and a program memory loaded with operating software associated with a library.

BRIEF DESCRIPTION OF THE DRAWINGS

The disclosed embodiments will be better understood from reading the following description and examining the figures accompanying it, which are given by way of indication and in no way limit the disclosed embodiments.

FIG. 1 is a schematic view of a test environment for the operating software of the onboard system according to the disclosed embodiments.

FIG. 2 shows a functional diagram of the method in the disclosed embodiments.

DETAILED DESCRIPTION

FIG. 1 shows a test environment for using the method of testing the operating software of the onboard system according to the disclosed embodiments.

The software being tested is intended to be run on a real computer, not shown. According to the disclosed embodiments, this computer is simulated. It is marked number 1 in FIG. 1.

This simulated computer 1 is a virtual equivalent of the real computer. A real computer is intended to be placed onboard an aircraft, for example. The simulated computer 1 is installed in a virtual target. The virtual target is an environment where the simulated computer 1 evolves. This environment, called a simulated environment 3 hereinafter, makes it possible to reproduce, on a host platform 2, the virtual equivalent of the hardware designed to test the real computer and/consequently, the operating software loaded in it.

The real computer is, for example, a piece of equipment in the system placed onboard the aircraft and designed to perform various functions necessary for the aircraft, like flight control applications, systems surveillance or displaying information.

The simulated environment 3 is an environment for performing software operating tests.

The simulated computer 1 operates virtually in the test performance environment. This test performance environment is simulated on the host platform 2. The simulated computer 1 has, in a non-exhaustive way, the different elements that are found in the real computer. The elements of the real computer are therefore reproduced virtually in the simulated computer 1.

The host platform 2 is a work station in the preferred embodiment of the disclosed embodiments.

The simulated computer 1 centralizes the operating resources of the simulated environment 3. In FIG. 1, the simulated computer 1 is shown schematically by a control unit. This control unit includes an arithmetic and logic unit 6, a program memory 7, a data memory 8 and an input/output interface 9. The arithmetic and logic unit 6, the program memory 7, the data memory 8 and the input/output interface 9 are connected to one another by a bidirectional communication bus 10.

In the traditional way, the arithmetic and logic unit 6 controlled by instructions recorded in the program memory 7 runs the applications of the simulated computer 1.

The program memory 7 is loaded with operating software 11. This operating software 11 has instructions assembled to form a series of instructions. The operating software 11 is designed to control and guide the real computer. This same operating software is also capable of controlling and guiding the simulated computer 1 via the arithmetic and logic unit 6. The operating software thus reproduces the same actions on the simulated computer 1 as on the real computer.

The operating software 11 also has instructions, which, when executed, make it possible to simulate an ordinary peripheral 4. The ordinary peripheral 4 simulates all of the input/output functionalities that the real computer has. In other words, the ordinary peripheral 4 has an input/output table identical to the one in the input/output peripheral of the real computer. The ordinary peripheral 4 permits the simulation of values on the input table of the real computer.

The simulated computer 1 therefore has a so-called ordinary peripheral that has the virtual equivalent of the input/output peripheral of the real computer.

To be able to see all of the test results and introduce new input/output functionalities in addition to the ones offered by the ordinary peripheral 4, the operating software 11 simulates a dedicated peripheral 5.

The dedicated peripheral 5 gives access to additional functionalities not accessible by the ordinary peripheral 4. The so-called dedicated peripheral has virtual inputs/outputs that are added compared to the existing ones for the input/output peripheral of the real computer. These additional functionalities can be access to read and/or write to the test results files of the host platform 2. These additional functionalities are recorded in a library 12. This library 12 is connected both to the operating software 11 being tested and to the dedicated peripheral 5. The library 12 contains a library of control functions, preferably simple ones, that the operating software can activate to control and guide the dedicated peripheral 5. This library can include a number of models of expandable control functions. The dedicated peripheral 5 thus allows the simulated computer 1 to establish an interface having functionalities in addition to the interface with the ordinary peripheral 4. The dedicated peripheral also makes it possible to send signals to the inputs of the simulated computer 1 or to read the outputs in the test results files. Running the operating software 11 allows it to dialogue with the simulated computer 1 via the dedicated peripheral 5 and the ordinary peripheral 4. The dedicated peripheral 5 is seen as an ordinary peripheral 4 by the arithmetic and logic unit 6.

The control functions from the library 12 are totally independent of the kind of operations performed by the ordinary peripheral 4.

From the standpoint of running the software on the onboard computer (and hence simulating it in the test performance environment), the control function is seen as a group of debanalized memory addresses.

A control function on the virtual dedicated peripheral is generally activated or run according to the following three steps:
    write to addresses of control functions of the dedicated peripheral in order to be able to transfer the control function parameters;
    write to an address of a control function to start running said function;
    read to an address of a control function to recover the status and potentially the data read.

The virtual dedicated peripheral is a three-phase software controller that is part of the simulator. It is activated on a read/write access to a debanalized address of the virtual computer.

In the first phase, it stores the parameters sent via the access memory in a single buffer zone.

In the second phase, the input/output operation commanded is performed, on the host platform, with the parameters in the buffer zone as real parameters.

In the third phase, the status is sent back via a read command function.

In one example, for an operation to open a file, we have "int open(const char *pathname, int flags)", this function has two input parameters "pathname" which is an address and "flags" which is an integer.

This function sends back a file identifier which is an integer.

Two debanalized addresses are used to control the virtual dedicated peripheral like "a1, a2".

The execution, on the virtual computer, of a file opening, to read for example, gives the following instructions:
const char *fic="fichier example [file.example]"
fd=open(fic, O_RDONLY);
fd is the value read The following sequence is thus obtained on the virtual computer:
    write the-code-of-the-function open at the address a1,
    write the-value-of-the-pointer fic at the address a1,
    write the-value-of-the-opening-mode flags at the address a1,
    write the-command-to-execute-the-function open at the address a2,
    read the-value-of-the-descriptor-open at the address a1.

The following sure sequence is then obtained at the time when the virtual dedicated peripheral is run:
    store the-code-of-the function in zone0, reset buffer zone,
    convert the-value-of-the-pointer fic into pointer on the virtual dedicated peripheral and store in zone1,
    store the-value-of-the-open-mode in zone2,
    zoneres=open((const char *)zone1, (int)zone2);
    return the value-of zoneres in response to the read access.

The command functions "write", "read", "store" and "return" are basic allocation instructions.

The command function "convert" the value-of-the-pointer is a function provided by practically all processor simulators. On a "basic" simulator where it did not exist, it could be replaced by a transfer loop word for word preceded by transferring the length of the word block.

Thus, the operating software 11 enables a user to have, via the library 12, direct read and/or write access to configuration and/or test results files by means of the dedicated peripheral 5.

The simulated virtual computer 1 with its ordinary 4 and dedicated peripherals 5 would make it possible to test the operating software in several operating phases of the onboard system, but would also enable the user to voluntarily cause breakdowns or hardware failures to see how said software behaved.

The simulated computer 1 also makes it possible to prevent the use of specific hardware while simulating a test performance environment for the operating software 11. Using the dedicated peripheral thus makes it possible to have a test performance environment that is less intrusive compared to the prior art. The dedicated peripheral 5 is mapped in the address space of the arithmetic and logic unit 6 of the virtual simulated computer 1, at peripheral addresses not used by the simulated environment 3. In other words, the address space (not shown) of the arithmetic and logic unit 6, not used by the simulated environment, is allocated to virtual addresses of the dedicated peripheral 5. This address space can, in one embodiment of the architecture of the simulated computer 1, be in, to say it another way, a memory space reserved for inputs/outputs, that is, in a specific input/output space.

The dedicated peripheral 5 makes it possible to access other functionalities available on the host platform 2. For that, the dedicated peripheral 5 is expanded. It is the same peripheral as the so-called virtual dedicated peripheral 5, except for the fact that it is possible to increase the number of functionalities other than inputs/outputs, of said peripheral, based on the possibilities made available by the host platform 2. Thus, the additional functions can be attributed to it. In this case, the library 12 is supplemented by adding and/or removing control functions. These functions are modified by the user, that is, by the software test specialist who is not, a priori, a specialist in the operating system of the host platform. The arithmetic and logic unit 6 then determines, from the control functions present in the library, the test sequences to be run on the software. In other words, the test to be performed is determined from control functions in the library.

It will be understood, on reading this description, that the simulated computer 1 has no direct or logic link to the host platform 2.

FIG. 2 gives a functional diagram of a test sequence using the method in the disclosed embodiments. This method includes a preliminary step 20, in which the operating software is loaded into the program memory 7 of the control unit of the simulated computer 1, and the different parameters of the test performance environment of said software are reinitialized. In this step, the operating software 11 is able to enter into a test phase 30. The test phase 30 corresponds to a series of steps necessary to check and see how the operating software 11 is running.

This test phase 30 has a step 21 in which the control unit of the simulated computer 1 determines the type of test to perform on the operating software 11 by adding or removing control functions in the library 12.

In step 22, the control unit of the simulated computer 1 starts running the operating software 11 in the simulated environment 3.

In step 23, the execution of the operating software 11 activates and/or deactivates different functions of the library 12 like functionalities to access results files. It is possible for the user to add and/or remove functionalities in the library 12. Activating functionalities in the library makes it possible to simulate virtually the dedicated peripheral 5 in the simulated environment 3.

In step 24, the control unit of the simulated computer 1 sends the results files into files on the host platform 2 based on the type of test performed on the operating software 11. In other words, the results of the tests are sent from the dedicated peripheral 5 to files on the host platform 2.

In step 25, the files of test results are recorded on the operating system of the host platform to be analyzed and to ensure tracking of the tests for certification by the competent authorities.

In step 26, the control unit determines whether the test sequence is finished. If the control unit has not returned a test end instruction, the test phase continues, i.e., steps 21 to 25 are repeated.

When all the necessary tests have been performed successfully, the software is normally able to be integrated into the real computer. The process ends when the operating software has been validated before being integrated into the real computer (step 27).

The disclosed embodiments, as it has just been described, make it possible to implement functionalities to access results files simply and flexibly, which makes it possible to limit the development cost of the operating software being tested.

The disclosed embodiments permit total independence of the dedicated peripheral vis-á-vis the operating system of the host platform 2, which allows the development of dedicated peripherals in the simulated environment 3 that takes no special knowledge, except the knowledge required to use files, and makes the test device practically insensitive to the changing features of the host platforms. The disclosed embodiments therefore require no notion of file distribution nor any system call conversion or interception.

The invention claimed is:

1. A virtual computer system comprising: a tester structured to test operating software in a virtual test environment, the operating software being intended to be embedded in an actual onboard system computer in an aircraft for controlling the onboard system computer to pilot the aircraft, the operating software reproducing the same actions on the virtual computer as on the real computer, the test system comprising:
   a host platform including a processor; and
   a non-transitory computer readable medium encoded with processor readable instructions that when executed by the processor of the host platform implement:
      preparation of a test to be performed on the operating software by adding and/or removing control functions in a function library connected to said operating software,
      running of the operating software intended for the onboard system computer in a virtual environment, simulation of a dedicated peripheral, that gives access to new input/output functionalities to be performed during actual operation of piloting the aircraft in addition to those offered by the onboard system computer not accessible by an ordinary peripheral which is a virtual equivalent of a real input/output peripheral of the onboard system computer, the dedicated peripheral being seen as the ordinary peripheral by the processor, by activating, during the running of the operation software in the virtual environment, the new input/output functionalities and one of the control functions from the library to see all test results from the operating software and introduce said new input/output functionalities, and
      sending of the test results on the operating software from the dedicated peripheral to results files supported by the host platform and record those results.

2. The system according to claim 1, wherein the dedicated peripheral has a virtual address that corresponds to a real address in the virtual test environment supported by the host platform.

3. The system according to claim 2, wherein the address space is a memory space reserved for inputs/outputs.

4. The system according to claim 1, wherein the library has a library of simple control functions that the operating software activates to control and guide the dedicated peripheral.

5. The system according to claim 4, wherein the control functions in the library are totally independent of the kind of operations performed by an ordinary peripheral.

6. A device comprising a processor and memory for simulating operation of an onboard aircraft system computer, wherein it uses the system according to claim 1.

7. The device in claim 6, wherein it includes a virtual test environment on the host platform that has a virtual computer, an ordinary peripheral and the dedicated peripheral.

8. The device in claim 7, wherein the virtual computer has an arithmetic and logic unit, a data memory and a program memory loaded with said operating software associated with a library.

* * * * *